United States Patent [19]
Funada et al.

[11] Patent Number: 5,164,580
[45] Date of Patent: Nov. 17, 1992

[54] ELECTROLUMINESCENT LIGHT-SOURCE-INCORPORATED IMAGE SENSOR

[75] Inventors: Masao Funada; Norikazu Yamada, both of Kanagawa, Japan

[73] Assignee: Fuji Xerox Co., Ltd., Tokyo, Japan

[21] Appl. No.: 708,713

[22] Filed: May 31, 1991

[30] Foreign Application Priority Data

Jun. 1, 1990 [JP] Japan .................................. 2-141298

[51] Int. Cl.$^5$ .............................................. H01J 40/14
[52] U.S. Cl. ................................. 250/208.1; 358/483
[58] Field of Search ............................ 250/208.1, 216; 358/482, 483, 484, 494; 357/30 H, 19

[56] References Cited

U.S. PATENT DOCUMENTS

| | | | |
|---|---|---|---|
| 4,970,381 | 11/1990 | Huang et al. | 358/483 |
| 5,086,218 | 2/1992 | Yagyu | 250/208.1 |

FOREIGN PATENT DOCUMENTS 59-210664 11/1984 Japan .

*Primary Examiner*—David C. Nelms
*Attorney, Agent, or Firm*—Finnegan, Henderson, Farabow, Garrett and Dunner

[57] ABSTRACT

A light-source-incorporated image sensor in which a light receiving element formed on an insulating substrate is confronted through a light transmission layer with an EL light emitting element formed on a transparent substrate. In the image sensor, the thickness of the transparent substrate is smaller than that of the light transmission layer, whereby the focal depth can be set to a value which is sufficient in practical use.

5 Claims, 4 Drawing Sheets

ELECTROLUMINESCENT LIGHT-SOURCE-INCORPORATED IMAGE SENSOR

BACKGROUND OF THE INVENTION

This invention relates to an image reading apparatus for a facsimile or scanner, and more particularly to a light-source-incorporated image sensor, in which a light receiving element and an EL (Electro Luminescence) light emitting element are provided as one unit for the purpose of miniaturization, which is made large in focal depth.

Heretofore, a facsimile or scanner employs an image reading apparatus which comprises: a light source, namely, a fluorescent lamp; an image sensor; and an equi-magnification optical system for forming the image of an original on the image sensor. The apparatus is disadvantageous in that, since a rod lens array or the like is employed as the equi-magnification optical system, the apparatus is difficult to miniaturize.

In order to eliminate this difficulty, an extremely small light-source-incorporated image sensor has been proposed in the art which is obtained by providing an EL light emitting element and a close contact type image sensor as one unit.

The light-source-incorporated image sensor is formed as follows: That is, as shown in FIGS. 5 and 6, a film light receiving array 11 is formed on an insulating substrate made of glass or the like by using amorphous silicon, a transparent insulating layer 12 is formed on the light receiving element array 11 thus formed, and then an EL light emitting element 13 is formed on the transparent insulating layer 12. The EL light emitting element 13 is of a sandwich structure, comprising a metal electrode 14, an insulating layer 15a, a light emitting layer 16, an insulating layer 15b, and a transparent electrode 17 which are formed one on another in the stated order. As shown in FIG. 6, the metal electrode 14 has a plurality of light incident windows 14a respectively in correspondence to light receiving portions 11a of the light receiving element array 11. The output light of the light emitting layer 16 is reflected from an original 100 placed on the side of the transparent electrode 17 so that it is applied through the light incident windows 14a to the light receiving portions 11a of the light receiving element array 11 (cf. Japanese Patent Unexamined Publication No. Sho. 59-210664).

In the light-source-incorporated image sensor thus constructed, the output light of the EL light emitting element 13 is applied to the surface of the original 100, and the light reflected from the surface of the original is applied to the light receiving element array 11. Hence, when the area of the light incident windows 14a of the metal electrode 14 is in a predetermined range, then the focal depth of the image sensor depends greatly on the distance $d_1$ between the original 100 and the light incident windows 14a of the metal electrode 14, and on the distance $d_2$ between the light receiving element array 11 and the light incident windows 14a of the metal electrode 14.

If the focal depth is small or shallow, then the resolution (MTF) of the image sensor is considerably decreased in the case where the original floats above the predetermined position, or in the case where the original itself is uneven (as in the case of a PPC original on which a thick toner layer is formed) or in the case where a thin original is read which is inserted into a document carrier made of transparent films. Accordingly, in these cases, the image reading operation is not satisfactorily carried out.

With the above-described conventional image reading apparatus, it is difficult to adjust the distance $d_1$ between the original 100 and the light incident windows 14a, and the thickness $d_2$ of the transparent insulating layer 12 to desired values. Accordingly, it is also difficult to obtain a light-source-incorporated image sensor improved in focal depth.

SUMMARY OF THE INVENTION

In view of the foregoing, an object of this invention is to provide a light-source-incorporated image sensor in which the focal depth can be adjusted to the extent that no problem is raised in practical use.

The foregoing object of the invention has been achieved by the provision of a light-source-incorporated image sensor according to the invention comprising a light receiving element formed on an insulating substrate, an EL light emitting element formed on a transparent substrate, and a light transmission layer provided between the light receiving element and the EL light emitting element, wherein a thickness $d_1$ of the transparent substrate and a thickness $d_2$ of the light transmission layer meet a relationship $d_1 < d_2$.

In the light-source-incorporated image sensor according to the invention, the output light of the EL light emitting element is applied to the surface of an original placed on one side of the transparent substrate which is opposite to the other side where the EL light emitting element is formed, and the light reflected therefrom is applied to the light receiving element. Furthermore, in the image sensor, the thickness $d_1$ of the transparent substrate is made smaller than the thickness $d_2$ of the light transmission layer. Hence, even when the surface of the original is not strictly in contact with the transparent substrate, the value of MTF is not so greatly decreased, so that the focal depth can be set to a value which is sufficient in practical use.

DETAILED DESCRIPTION OF THE INVENTION

Figure 1:
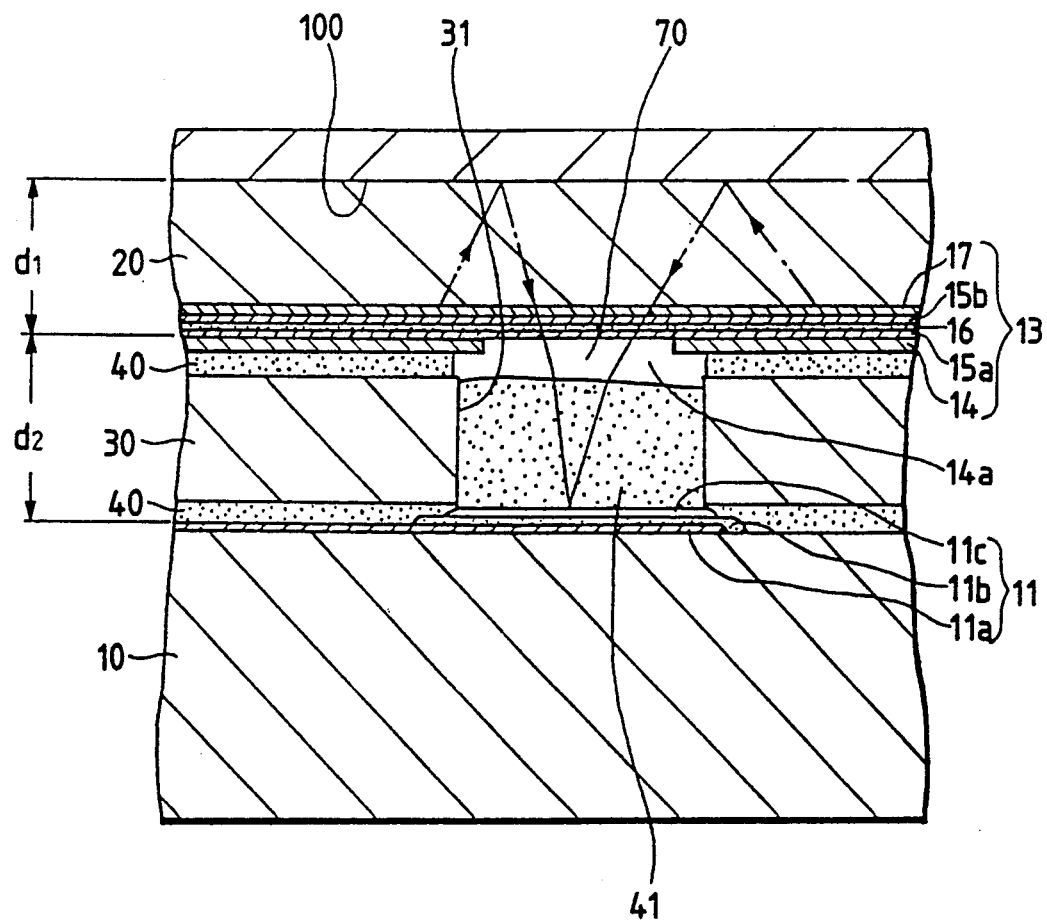
FIG. 1 is a sectional view showing a light-source-incorporated image sensor according to an embodiment of the invention.
Figure 5:
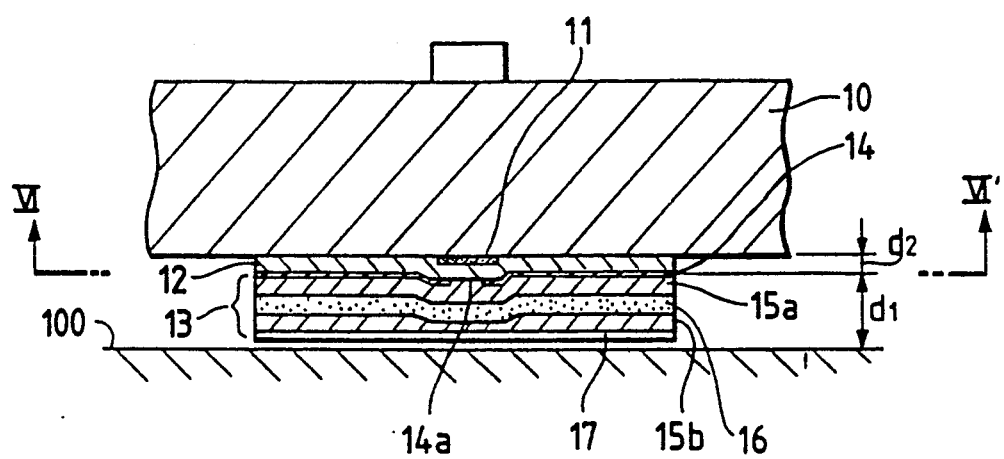
FIG. 5 is a sectional view showing a conventional image reading apparatus.
Figure 6:
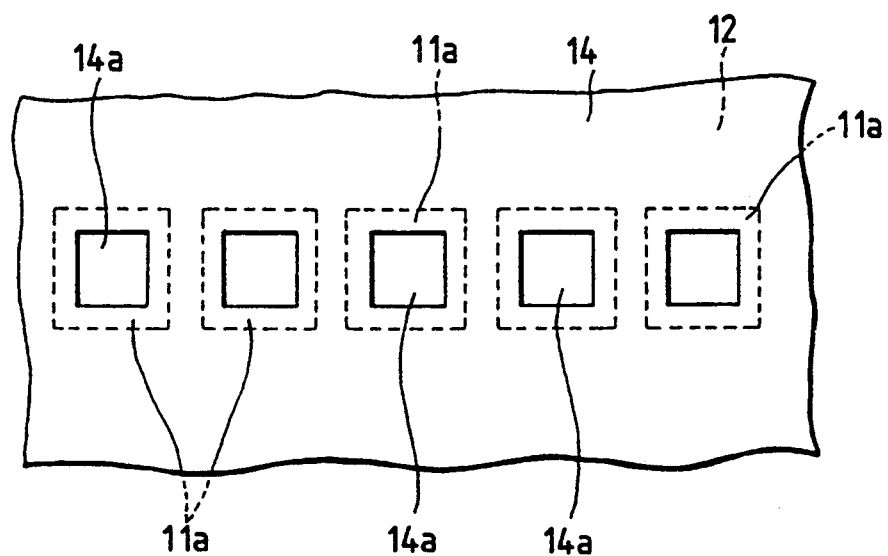
FIG. 6 is an explanatory sectional diagram taken along line VI—VI' in FIG. 5, showing the positional relationships between the light receiving portions of a light receiving element and the light incident windows of an EL light emitting element.

Preferred embodiments of this invention will be described with reference to the accompanying drawings. FIG. 1 is a sectional view showing a light-source-incorporated image sensor according to an embodiment of the invention. In FIG. 1, parts corresponding functionally to those which have been described with reference to FIGS. 5 and are therefore designated by the same reference numerals or characters.

The image sensor, as shown in FIG. 1, includes a light receiving element array 11 is made up of a plurality of sensors arranged in a direction perpendicular to the drawing. Each of the sensors is obtained by forming an individual electrode (chromium pattern) 11a, an amorphous silicon (a-Si) layer, and a belt-shaped transparent electrode (ITO) 11c on a substrate 10 in the state order.

The image sensor further includes an EL light emitting element 13 which is obtained by forming a transparent electrode 17, an insulating layer 15b, a light emitting layer 16, an insulating layer 15a, and an opaque metal electrode 14 on a transparent substrate 20 in the stated order. The transparent electrode 17 is of ITO, $In_2O_3$ or $SnO_2$; the insulating layers 15a and 15b are of $Y_2O_3$, $Si_3N_4$ or $BaTiO_3$; the light emitting layer 16 is of ZnS:Mn; and the opaque metal electrode 14 is of a metal such as aluminum.

The metal electrode 14 has square light incident windows 14a above the light receiving portions 11a of the light receiving element array 11 so that the output light of the light emitting layer 16 which has been reflected from the surface of the original 100 is applied to the light receiving element array 11. The light incident windows 14a are formed as follows: First, the opaque metal electrode 14 is formed by using a metal such as aluminum, and then it is etched by photolithography.

A transparent insulating flat plate 30 made of a glass plate is interposed between the light receiving element array 11 and the EL light emitting element 13 so that the light receiving element array 11 and the EL light emitting element 13 are insulated from each other and are spaced with a predetermined distance from each other. An elongated window 31 is formed in the transparent insulating flat plate 30 along the light receiving element array 11, or in a direction perpendicular to the drawing.

The substrate 10 is stuck on one side of the transparent insulating flat plate 30 through an adhesive layer 40, while the transparent substrate 20 is stuck on the other side of the transparent insulating flat plate 30 through another adhesive layer 40 in such a manner that the light incident windows 14a of the EL light emitting element 13 are confronted with the light receiving portions 11a of the light receiving element array 11. In this case, an air layer 70 is interposed over the light receiving element array 11. In order to reduce the thickness of the air layer 70, an adhesive layer 41 is formed in the elongated window 31, which serves as a light transmission layer. Since the air layer 70 is provided in this manner, the light emitted from the light emitting layer 16 toward the surface of the original 100 is total-reflected by the interface between the transparent substrate 20 and the air of the atmosphere but the reflected light is not total-reflected by the interface between the transparent substrate 20 and the air layer 70, so that it may be applied to the light receiving element array 11. The reason why the air layer 70 is reduced in thickness is to allow the adhesive layer 41 to refract the light so that the light may advance far. This structure prevents the difficulty that the incidence of light from other than an aimed picture element is increased because of the incident of light from a position which is at a distance corresponding to several picture elements from the aimed picture element, to prevent the degradation of the MTF.

The insulating substrate 10, the transparent insulating flat plate 30 and the transparent substrate 20 are joined together in the following manner. Both sides of the transparent insulating flat plate 30 on which the adhesive layers 40 and 40 are formed, and the transparent substrate 20 are laid on the insulating substrate 10 one after another, and then the adhesive layer 41 is formed in the window 31. Under this condition, the transparent substrate 20 is pressurized uniformly.

In the above-described embodiment, the transparent insulating flat plate 30 is interposed between the EL light emitting element 13 and the light receiving element array 11. Hence, the EL light emitting element is high in moisture resistance, and accordingly it is sufficiently long in service life. Furthermore, the EL light emitting element is maintained unchanged in the light emitting characteristic for a long time. The moisture resistance can be further improved by filling the space between the EL light emitting element 13 and the transparent insulating flat plate 30 with silicon resin or epoxy resin.

Figure 2:
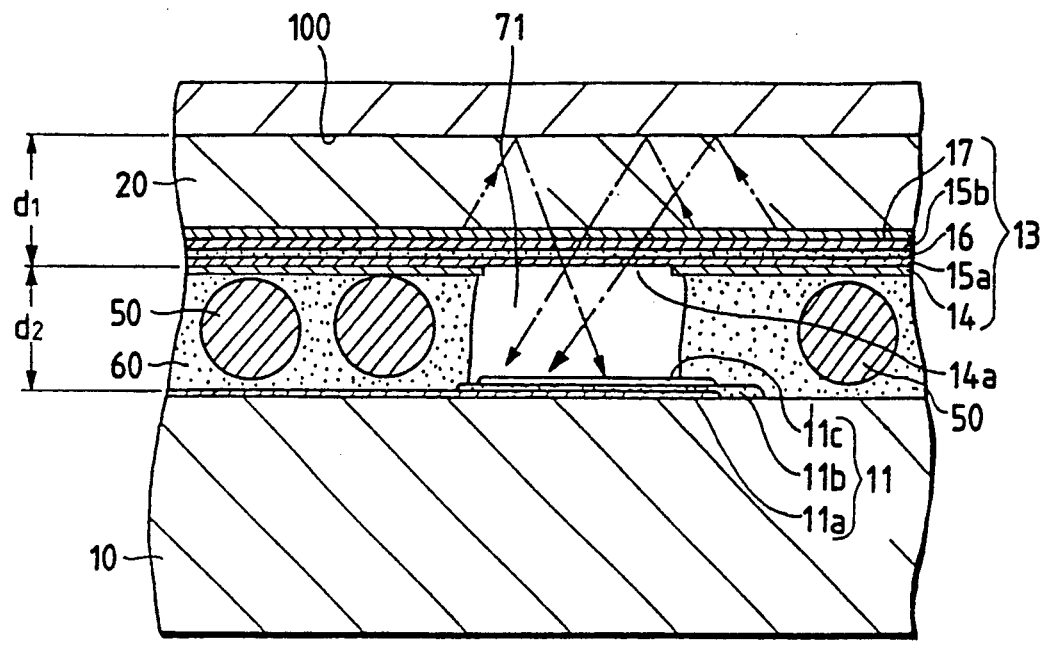
FIG. 2 is a sectional view showing a light-source-incorporated image sensor according to another embodiment of the invention.

FIG. 2 shows a light-source-incorporated image sensor according to another embodiment of the invention. In this embodiment, transparent spherical spacers 50 are employed instead of the transparent insulating flat plate 30.

In the embodiment, the transparent substrate 20 on which the EL light emitting element 13 has been formed is combined with the insulating substrate 10 on which the light receiving element array 11 has been formed, as follows: First, the spherical spacers 50, which are equal in size, are scattered in transparent adhesive 60, and then they are applied to the substrate except for the portion which corresponds to the light receiving element array 11. Under this condition, similarly as in the above-described first embodiment, the two substrates are combined together in such a manner that the light incident windows 14a of the EL light emitting element 13 confront with the light receiving portions 11a of the light receiving element array 11, and a uniform pressure is applied to the substrates thus combined. In this case also, an air layer 71 serving as a light transmission layer is formed over the light receiving element array 11.

The spherical spacers 50 ("Micropearl SP" manufactured by Sekisui Fine Chemical Co., Ltd.) are spherical hard plastic particles which are high in heat resistance and in insulation and have an equi-refractive index of the transparent substrate 20.

In the light-source-incorporated image sensor, the thickness of the EL light emitting element 13 or the light receiving element array 11 is smaller than the thickness of the transparent substrate 20 or the light transmission layer (the air layer 70 plus the adhesive layer 41 or the air layer 71) or than the diameter of the spherical spacers. Therefore, the distance $d_1$ between the surface of the original 100 and the light incident window 14a of the metal electrode 14 of the EL light emitting element 13 is determined from the thickness of the transparent substrate 20 on which the EL light emitting element 13 is formed; and the distance $d_2$ between the light receiving element array 11 and the light incident window 14a of the metal electrode 14 is determined from the thickness of the transparent insulating flat plate 30 or the diameter of the spherical spacers 50. Hence, the focal depth can be adjusted by changing the thickness of the transparent substrate 20 and the transparent insulating flat plate 30.

In order to detect the relation between the distances $d_1$ and $d_2$ which is suitable for improvement of the focal depth, a simulation was carried out with a computer.

Figure 3:
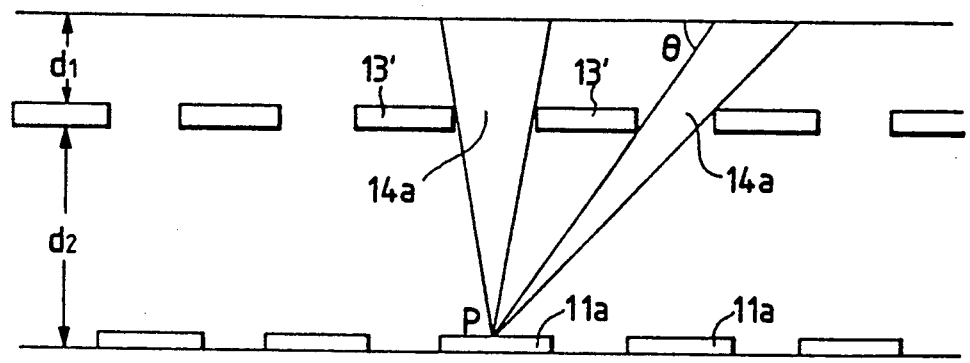
FIG. 3 is an explanatory diagram showing the arrangement of the light-source-incorporated image sensor in the main scanning direction.

The illuminance dE at a point P on the light receiving portion 11a of the light receiving element array 11 due to a fine area dS on the light source will be described with reference to FIG. 3 (in which no refractive index is taken into account). Assuming that the surface of the original reflecting the output light of the light emitting portion 13' of the EL light emitting element 13 is a phantom light source, $$dE = B(\cos^2\theta/r^2) dS$$

where B is the luminance of the phantom light source, r is the distance from the phantom light source, and $\theta$ is the angle between the straight line connecting the phantom light source and the illuminance observation point P and the normal of the phantom light source.

Further, the resolution (MTF) of the optical system is as follows:

$$MTF = \{(Lw - Lb)/(Lw + Lb)\} \times 100$$

where Lw is the average value of the illuminance which, when the surface of the original right above the light receiving portion 11a of the light receiving element array 11 is white, is applied to the light receiving portion 11a by the surface of the original, and Lb is the average value of the illuminance when the surface of the original is black.

In order to measure the focal depth, a chart (4 line pairs/mm) on which black and white lines each having the width of 125 $\mu$m are formed alternately was inserted into document carriers different in thickness, and, with the chart set away from the transparent substrate 20 as much as the thickness of the document carrier, the MTF was calculated.

More specifically, in the calculation, the light-source-incorporated image sensor gas as follows: The thickness of the transparent substrate 20 was 50 $\mu$m($d_1$), the refractive index of the transparent substrate 20 was 1.49; the thickness of the transparent electrode 17 (ITO) forming the EL light emitting element 13 was 0.14 $\mu$m, the refractive index of the transparent electrode 17 was 1.70; the thickness of the insulating layer 15a or 15b (a-SiN$_x$) was 0.30 $\mu$m, the refractive index of the insulating layer 15a or 15b was 1.80; the thickness of the light emitting layer 16 (ZnS:Mn,TbF$_3$) was 0.50 $\mu$m, the refractive index of the light emitting layer 16 was 2.45; the thickness of the air layer 70 was 2 $\mu$m, the refractive index of the air layer 70 is 1.00; and the size of the light incident window 14a was 55 $\mu$m $\times$ 55 $\mu$m. Furthermore, as for each receiving portion 11a, the calculation was carried out with the incident light beams from eleven light incident windows taken into account which included the light incident window right above the light receiving portion and light incident windows adjacent thereto in the main scanning direction. Furthermore, it was assumed that the surface of the original was a complete diffusion surface and was irradiated uniformly.

For the MTF, the calculation was made using the quantity of light on the light receiving portion 11a with the auxiliary scanning direction not taken into consideration.

Figure 4:
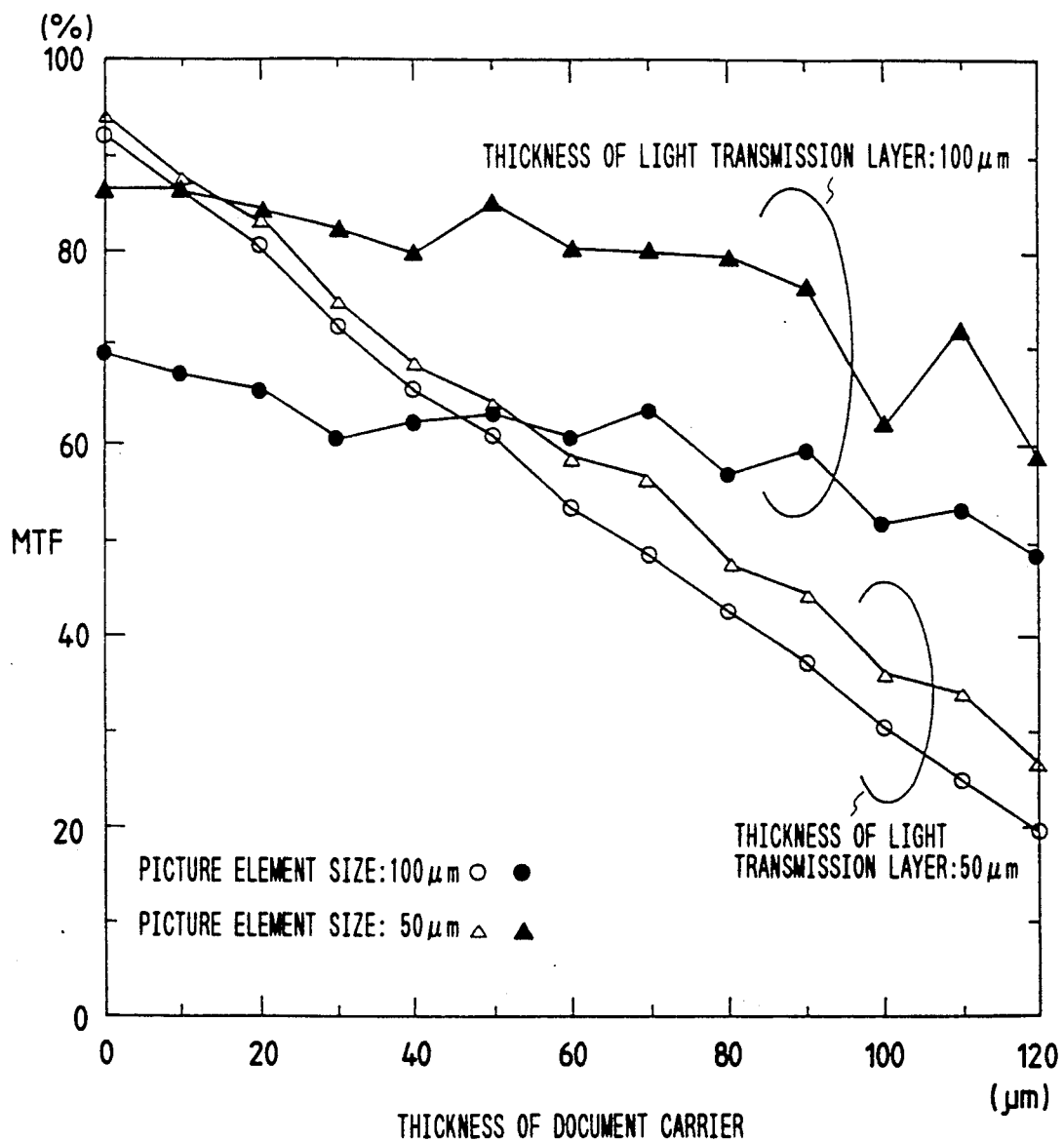
FIG. 4 is a graphical representation indicating the results of a simulation which is carried out with a computer in order to obtain the resolution (MTF) of the image sensor with the thickness of a document carrier varied.

The results of calculation are as indicated in FIG. 4. In FIG. 4, the values of MTF are indicated with black round dots with respect to the thickness of the document carrier varied under the conditions that the picture element pitch of the light receiving element array 11 is 125 $\mu$m (200 SPI), the picture element size is 100 $\mu$m $\times$ 100 $\mu$m, and the thickness of the light transmission layer is 100 $\mu$m ($d_2$) (the thickness of the air layer 70 is 2 $\mu$m, and the thickness of the adhesive layer 41 is 98 $\mu$m).

Similarly, the values of MTF are indicated by the black triangular dots which were obtained in the case where the picture element size is 50 $\mu$m $\times$ 50 $\mu$m.

The values of MTF are indicated with white round dots with respect to the thickness of the document carrier varied under the conditions that the picture element size is 100 $\mu$m $\times$ 100 $\mu$m, and the thickness of the light transmission layer is 50 $\mu$m ($d_2$) (the thickness of the air layer 70 is 2 $\mu$m, and the thickness of the adhesive layer 41 is 48 $\mu$m).

Similarly, the values of MTF are indicated with white triangular dots which were obtained in the case where the picture element size is 50 $\mu$m $\times$ 50 $\mu$m.

As is apparent from the above-described results of MTF, in the case where the area of the light incident window 14a is ranged, in area ratio, from a value substantially equal to that of the light receiving portion 11a to a value which is about a quarter ($\frac{1}{4}$) thereof, the inclination in reduction of the MTF with respect to the variation in thickness of the document carrier is more moderate with $d_1 < d_2$ ($d_2 = 100$ $\mu$m) than with $d_1 = d_2$ ($d_2 = 50$ $\mu$m). That is, with $d_1 < d_2$ the focal depth can be set larger.

Thus, with the above-described embodiment, by using the transparent insulating flat plate 30 or the spherical spacers 50, with respect to the thickness of the transparent substrate 20 (the distance $d_1$ between the EL light emitting element 13 and the original 100), the distance $d_2$ between the light receiving element array 11 and the EL light emitting element 13 can be adjusted with ease. With $d_1 < d_2$, the focal depth can be set to a large value.

In addition, it is preferable to meet the following conditions:

$$d_1 + d_3 = d_2, \text{ and}$$

$$1 \leq d_1 + d_3 (= d_2) \leq 2d_4$$

where $d_3$ is the thickness of the document carrier, and $d_4$ is the picture element pitch of the light receiving element array.

In the light-source-incorporated image sensor according to the invention, the EL light emitting element and the light receiving element array are joined together which are formed on the different substrates, respectively. Therefore, the thickness $d_1$ of the transparent substrate and the thickness $d_2$ of the light transmission layer can be set to desired values. Furthermore, in the light-source-incorporated image sensor, the thickness $d_1$ of the transparent substrate is smaller than the thickness $d_2$ of the light transmission layer, and therefore even when the surface of the original is not strictly in contact with the transparent substrate, the value of MTF is not so greatly decreased. Thus, the focal depth can be obtained which is sufficient in practical use.

While there has been described in connection with the preferred embodiments of the invention, it will be obvious to those skilled in the art that various changes and modifications may be made therein without departing from the invention, and it is aimed, therefore, to cover in the appended claims all such changes and modifications as fall within the true spirit and scope of the invention.

What is claimed is:

1. A light-source-incorporated image sensor comprising:

a light receiving element formed on an insulating substrate;

an EL light emitting element formed on a transparent substrate; and a light transmission layer provided between said light receiving element and said EL light emitting element, wherein a thickness $d_1$ of said transparent substrate and a thickness $d_2$ of said light transmission layer meet a relationship $d_1 < d_2$.

2. A light-source-incorporated image sensor according to claim 1, further comprising a transparent insulating flat plate provided between said light receiving element and said EL light emitting element.

3. A light-source-incorporated image sensor according to claim 2, wherein said light transmission layer includes an air layer and an adhesive layer.

4. A light-source-incorporated image sensor according to claim 1, further comprising a plurality of spherical spacers provided between said light receiving element and said EL light emitting element.

5. A light-source-incorporated image sensor according to claim 4, wherein said light transmission layer includes an air layer.

* * * * *